Aug. 5, 1969 C. W. BRAY 3,460,051

LOW-DISTORTION GAIN AND PHASE-STABLE POWER AMPLIFIER

Filed Nov. 14, 1967

Chester W. Bray,
INVENTOR.

BY Harry M. Saragovitz
Edward J. Kelly
Herbert Berl
Aubrey J. Dunn

United States Patent Office 3,460,051

Patented Aug. 5, 1969

3,460,051

LOW-DISTORTION GAIN AND PHASE-STABLE POWER AMPLIFIER

Chester W. Bray, Onondaga, N.Y., assignor, by mesne assignments, to the United States of America as represented by the Secretary of the Army Filed Nov. 14, 1967, Ser. No. 682,832

Int. Cl. H03f 3/68

U.S. Cl. 330—124 1 Claim

ABSTRACT OF THE DISCLOSURE

A low-distortion voltage amplifier and an emitter follower in parallel with a Class A power amplifier to obtain an overall amplifier whose linearity, phase shift, distortion, gain and output impedance are those of an essentially unloaded amplifier designed for minimum distortion while having the power output capability of a power amplifier.

SUMMAY OF THE INVENTION

The present invention is for an amplifier which utilizes a low-distortion volage amplifier and an emitter follower (A1) in parallel with a Class A power amplifier (A2) to obtain an overall amplifier whose linearity, phase shift, distortion, gain and output impedance are those of an essentially unloaded amplifier designed for minimum distortion while having the power output capability of a power amplifier.

A1 is designed for minimum distortion and uses negative feedback to produce a low output impedance and to approximate a voltage source. A2 is designed to have a high output impedance to approximate a current source and to have phase shift and gain coinciding with that of A1 over the frequency range of interest. When phase and amplitude of the two correspond, A2 supplies the power to the load and A1 acts on the output only to correct for distortion, phase shift and amplitude changes in A2.

DESCRIPTION OF THE PREFERRED EMBODIMENT

Figure 1:
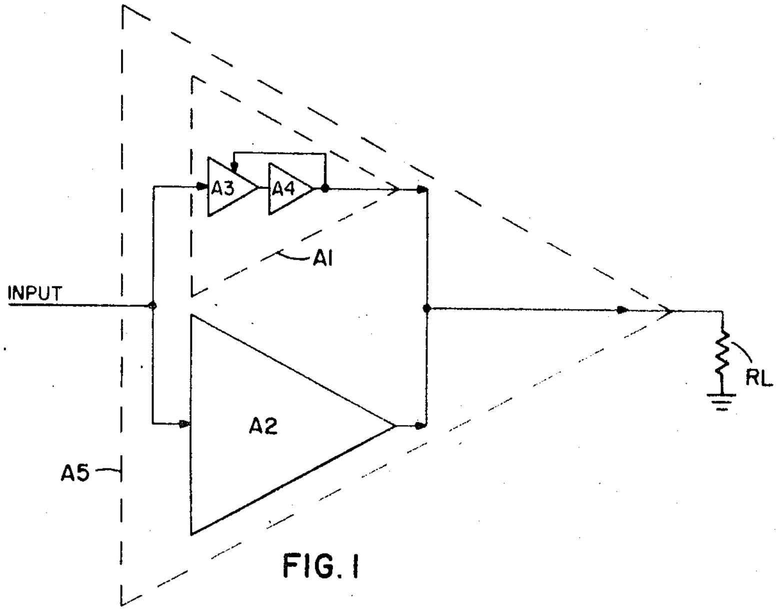
FIGURE 1 is a block diagram of the present invention.

Referring to FIGURE 1, amplifiers A1 and A2 are connected in parallel. Amplifier A1 consists of the series connection of a low-distortion voltage amplifier A3 and emitter follower amplifier A4. To obtain minimum distortion from amplifier A1, negative feedback is used from the output of the emitter follower A4 to the input of voltage amplifier A3. A2 is a Class A power amplifier. The amplifier A5 produced by the parallel connection of A1 and A2 has linearity, phase shift, distortion, gain and output impedance which are essentially those of an unloaded amplifier designed for minimum distortion while having the power output capability of a power amplifier. The gain and phase of A2, including the load, is designed to be the same as the gain and phase of A1. As a result, practically all of the current into the load is supplied by A2 while A1 acts as a stabilizing amplifier and either absorbs or delivers power as required to correct for distortion or gain changes originating in A2.

Figure 2:
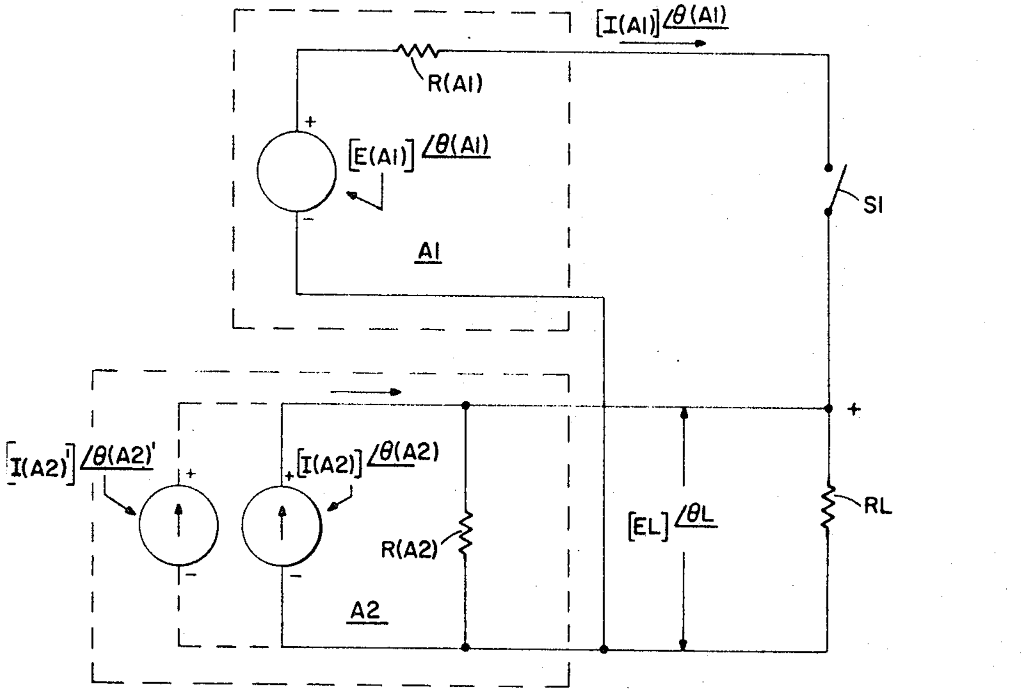
FIGURE 2 is a block diagram of the present invention showing the equivalent circuits of amplifiers A1 and A2.

The equivalent circuits of the output stages of A1 and A2 are shown in FIGURE 2. Since A1 is by definition primarily a voltage amplifier with a low output impedance, its output stage is represented as a voltage source E(A1) in series with a low internal resistance R(A1).

Since A(2) is defined as primarily a power amplifier with a high output impedance, its output stage is represented as a current source I(A2) in parallel with a high resistance R(A2). An additional current generator I(A2)′ is shown. This additional current generator represents a distortion current source. A switch S1 is shown between A1 and A2 in order to show the corrective effective of A1 on A2. With switch S1 open, the voltage across load $R_L$ is:

$$E_L=\frac{I(A2)}{\frac{1}{R(A2)}+\frac{1}{R_L}} \quad (1)$$

$$E_L'=\frac{I(A2)'}{\frac{1}{R(A2)}+\frac{1}{R_L}} \quad (2)$$

Equation 1 represents the output voltage at the desired frequency with A1 disconnected. Equation 2 represents the distortion component of output voltage (often the second harmonic of the desired frequency) with A1 disconnected.

With switch S1 closed, the voltage across the load $R_L$ is:

$$E_L=\frac{\frac{E(A1)}{R(A1)}+I(A2)}{\frac{1}{R(A1)}+\frac{1}{R(A2)}+\frac{1}{R_L}} \quad (3)$$

$$E_L'=\frac{I(A2)'}{\frac{1}{R(A1)}+\frac{1}{R(A2)}+\frac{1}{R_L}} \quad (4)$$

Equation 3 represents the output voltage at the desired frequency with A1 connected. Equation 4 represents the distortion output voltage with A1 connected.

The correcting effect of A1 on the output of A2 may be better demonstrated by a typical example: Let R(A1)=10 ohms, R(A2)=1000 ohms, and $R_L$=50 ohms. It is desired that the voltage across the load be $$5.00\angle 0^\circ$$

volts. Suppose that $$E(A1)=5.00\angle 0^\circ$$

and that $$I(A2)=0.1155\angle 0^\circ$$

amperes. Let $$I(A2)'=0.01155\angle 0^\circ$$

amperes, represent a second harmonic distortion. First, let S1 be open. Then Equation 1 and 2

$$E_L=\frac{0.1155\angle -10^\circ}{\frac{1}{1000}+\frac{1}{50}}=5.5\angle -10^\circ \text{ volts} \quad (1)$$

$$E_L'=\frac{0.1155\angle -0^\circ}{\frac{1}{1000}+\frac{1}{50}}=0.55\angle 0^\circ \text{ volts} \quad (2)$$

Second, let S1 be closed, then by Equation 3 and 4

$$E_L=\frac{\frac{5.00\angle 0^\circ}{10}+0.1155\angle -10^\circ}{\frac{1}{10}+\frac{1}{1000}+\frac{1}{50}}=5.075\angle -1.87^\circ \quad (3)$$

$$E_L'=\frac{\frac{0}{10}+0.01155}{\frac{1}{10}+\frac{1}{1000}+\frac{1}{50}}=0.0954 \text{ volts} \quad (4)$$

Therefore, A1 has reduced the distortion from 0.55 volts to 0.0954 volts, i.e. from 10% to 0.954%. The phase shift has been reduced from −10° to −1.87°; and the amplitude from 5.5 volts to 5.075 volts; i.e. from 10% error to 1.5% error.

When the phase and amplitude of A1 and A2 correspond, A2 supplies the power to the load. To demonstrate how the present invention does this, let S1 be closed. The total power supplied to the load is:

$$P_L=\frac{(E_L)^2}{R_L} \qquad (5)$$

The power supplied to the circuit by A1 is:

$$P(A1)=[E(A1)]\ [I(A1)]\ [\cos\ (\theta(A1)-\theta(A2)] \qquad (6)$$

where $\theta$ is the phase angle and $$I(A1)=\frac{\left([E(A1)]\underline{/\theta(A1)}-E_L\underline{/\theta_L}\right)}{R(A1)} \qquad (7)$$

Let E(A1)=5$\underline{/0^\circ}$ volts and I(A2)=0.105$\underline{/0^\circ}$ amperes. Then by (3)

$$E_L=\frac{\frac{5.00\underline{/0^\circ}}{10}+0.105\underline{/0^\circ}}{\frac{1}{10}+\frac{1}{1000}+\frac{1}{50}}=5.00\underline{/0^\circ}\text{ volts}$$

by (7), $$I(A1)=\frac{5\underline{/0^\circ}-5\underline{/0^\circ}}{10}=0$$

therefore, by (6) P(A1)=(5)($\theta$)(cos $\theta$°)=0. Since the voltage and phase across the load is identical to the voltage and phase of E(A1), A(1) contributes to power to the load.

Obviously, many modifications and variations of the present invention are possible in the light of the above teachings.

I claim:

1. A low-distortion gain and phase stable power amplifier comprising a first and second amplifier connected in parallel; a load connected to the output of said amplifiers, said load having a resistance $R_L$; said first amplifier being a voltage amplifier with a low output impedance and having an equivalent output voltage $$E(A1)\underline{/\theta(A1)}$$

and an equivalent internal resistance R(A1); said second amplifier being a power amplified with a high output impedance and having an equivalent output current $$I(A2)\underline{/\theta(A2)}$$

and an equivalent internal resistance R(A2); the gain and phase of said first amplifier being the same as the gain and phase of said second amplifier, including the load; said second amplifier supplying practically all of the current into said load; said first amplifier acting as a stabilizing amplifier to either absorb or deliver power as required to correct for distortion or gain changes originating in said second amplifier such that the load voltage is:

$$\frac{\frac{E(A1)}{R(A1)}+I(A2)}{\frac{1}{R(A1)}+\frac{1}{R(A2)}+\frac{1}{R_L}}$$

References Cited

UNITED STATES PATENTS

| | | | |
|---|---|---|---|
| 2,923,888 | 2/1960 | Buesing | 330—124 |
| 3,195,064 | 7/1965 | Offner | 330—30 X |
| 3,336,540 | 8/1967 | Kwartiroff et al | 330—30 X |
| 3,377,425 | 4/1968 | Buzan. | |

ROY LAKE, Primary Examiner

J. B. MULLINS, Assistant Examiner

U.S. Cl. X.R.

330—149